(12) United States Patent
Tsuchiko

(10) Patent No.: US 8,097,905 B2
(45) Date of Patent: Jan. 17, 2012

(54) CASCODED HIGH VOLTAGE JUNCTION FIELD EFFECT TRANSISTOR

(75) Inventor: Hideaki Tsuchiko, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/928,107

(22) Filed: Dec. 2, 2010

(65) Prior Publication Data

US 2011/0079825 A1  Apr. 7, 2011

(51) Int. Cl.
*H01L 29/66* (2006.01)
*H01L 21/337* (2006.01)

(52) U.S. Cl. ............ 257/272; 257/E29.242; 257/E21.4; 438/186

(58) Field of Classification Search .......... 257/272, 257/341, E29.242, E21.4, 268, E29.312, 257/E21.445; 438/186, 188
See application file for complete search history.

(56) References Cited

U.S. PATENT DOCUMENTS

| | | | | |
|---|---|---|---|---|
| 4,800,172 A | * | 1/1989 | Okano et al. | 438/195 |
| 5,087,889 A | * | 2/1992 | Butler | 330/253 |
| 5,338,949 A | * | 8/1994 | Schoofs | 257/269 |
| 7,719,055 B1 | * | 5/2010 | McNutt et al. | 257/341 |

* cited by examiner

*Primary Examiner* — Lex Malsawma
(74) *Attorney, Agent, or Firm* — Bo-In Lin

(57) ABSTRACT

A cascoded junction field transistor (JFET) device comprises a first stage high voltage JFET cascoded to a second stage low voltage JFET wherein one of the first and second stages JFET is connected to a drain electrode of another JFET stage.

20 Claims, 11 Drawing Sheets

Present Invention

Present Invention

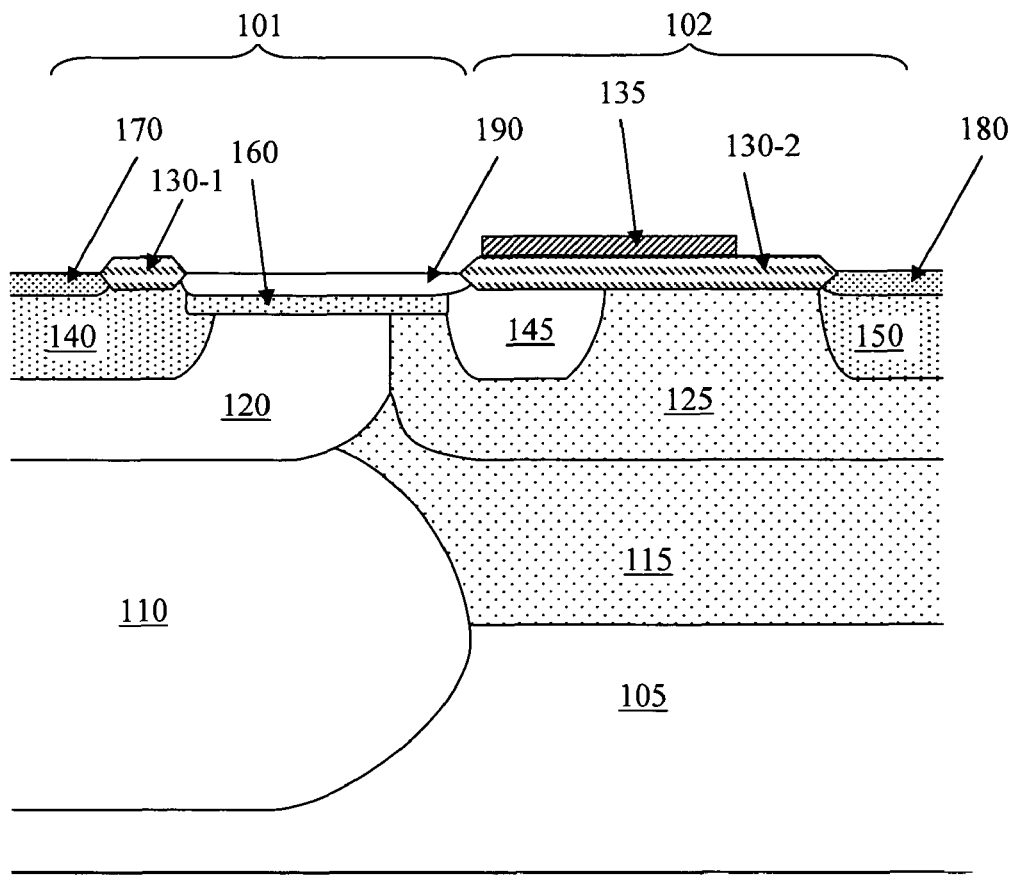
Fig. 2A Present Invention
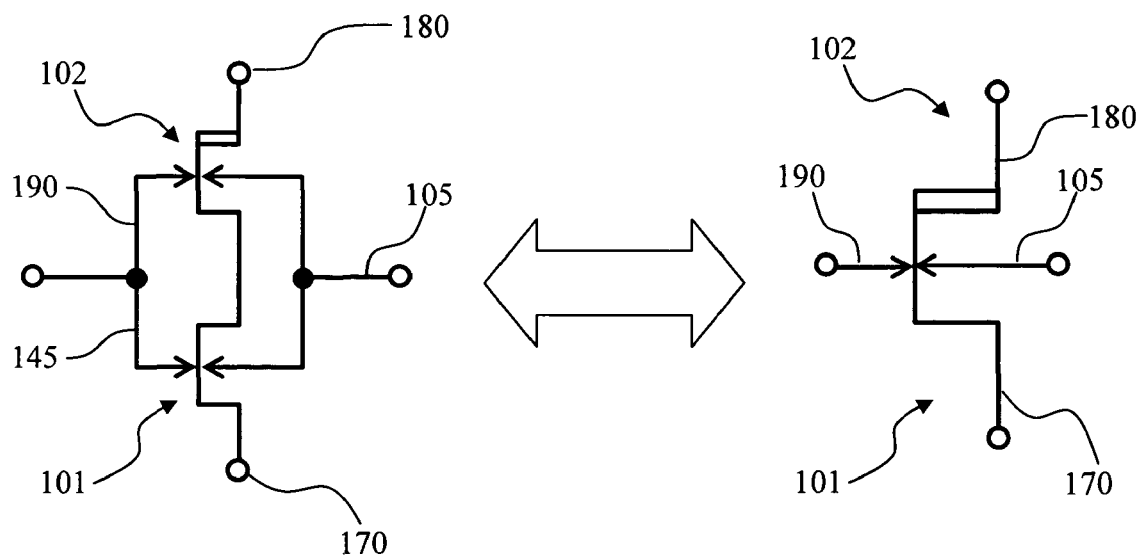
Fig. 2B Present Invention

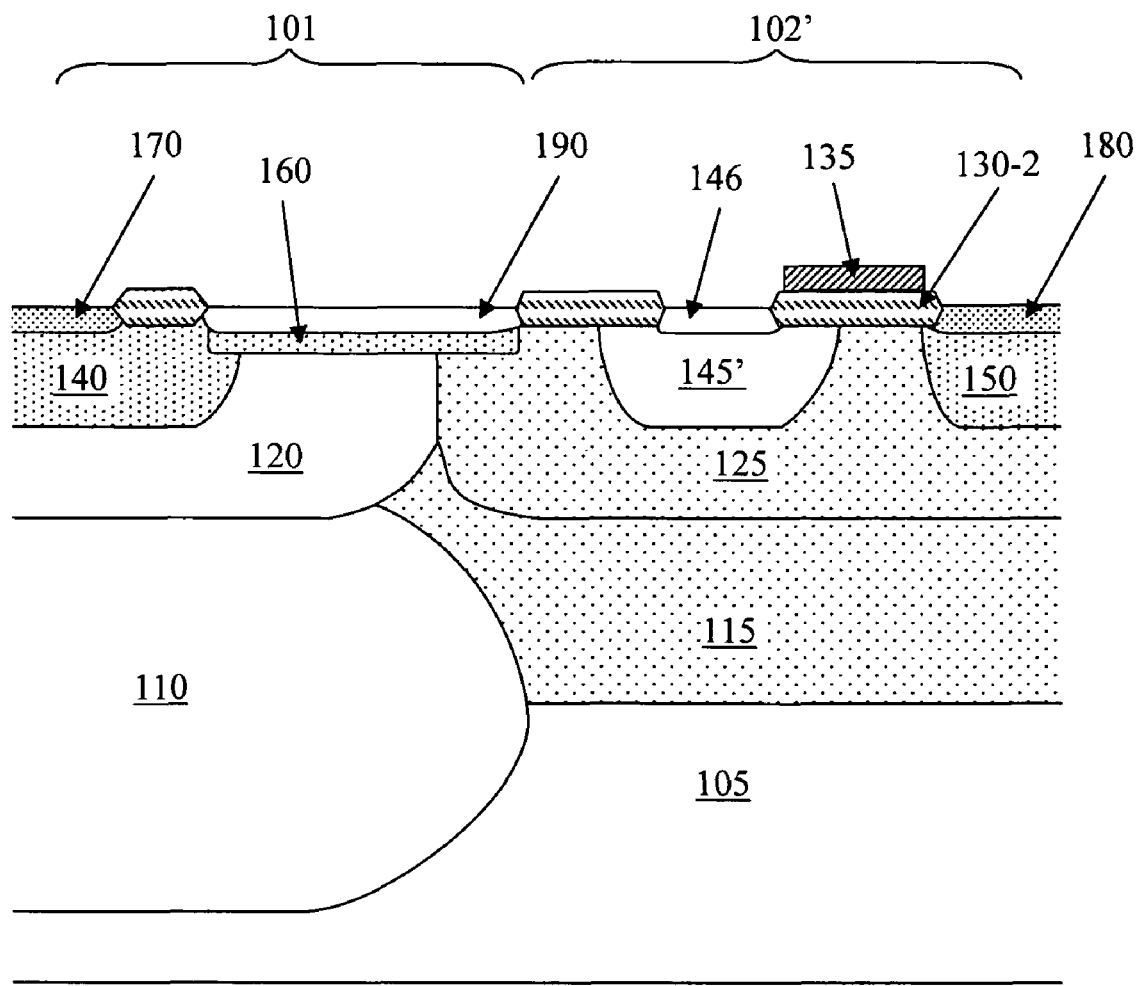
Fig. 2C Present Invention

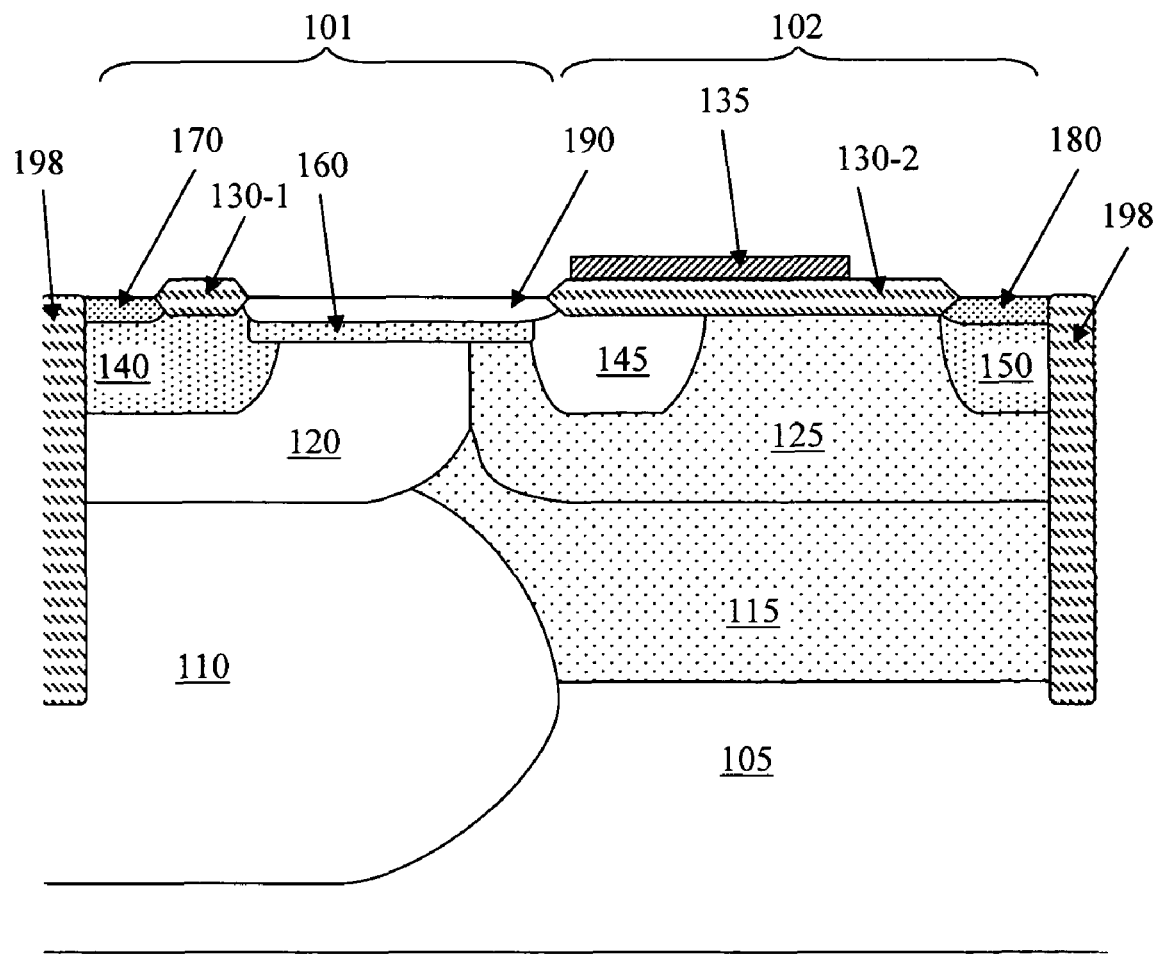
Fig. 2D Present Invention

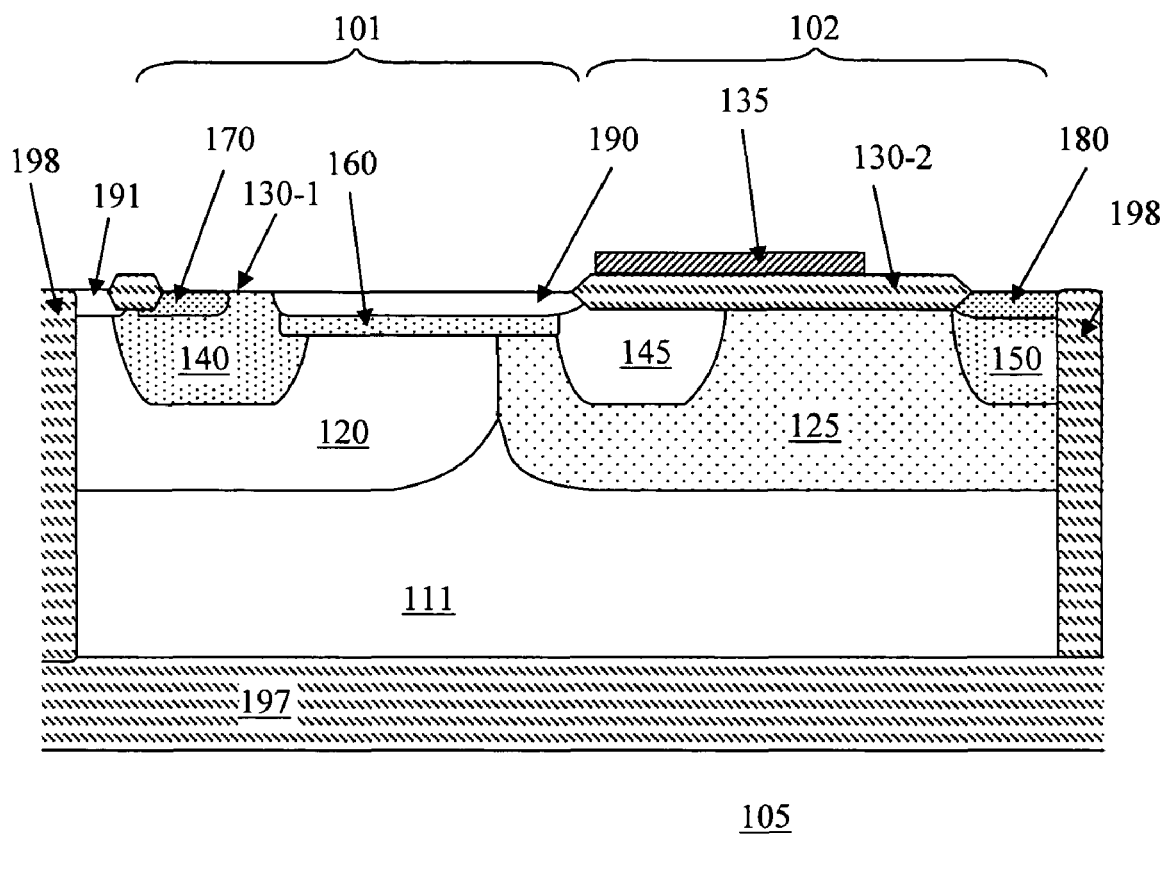
Fig. 2E Present Invention

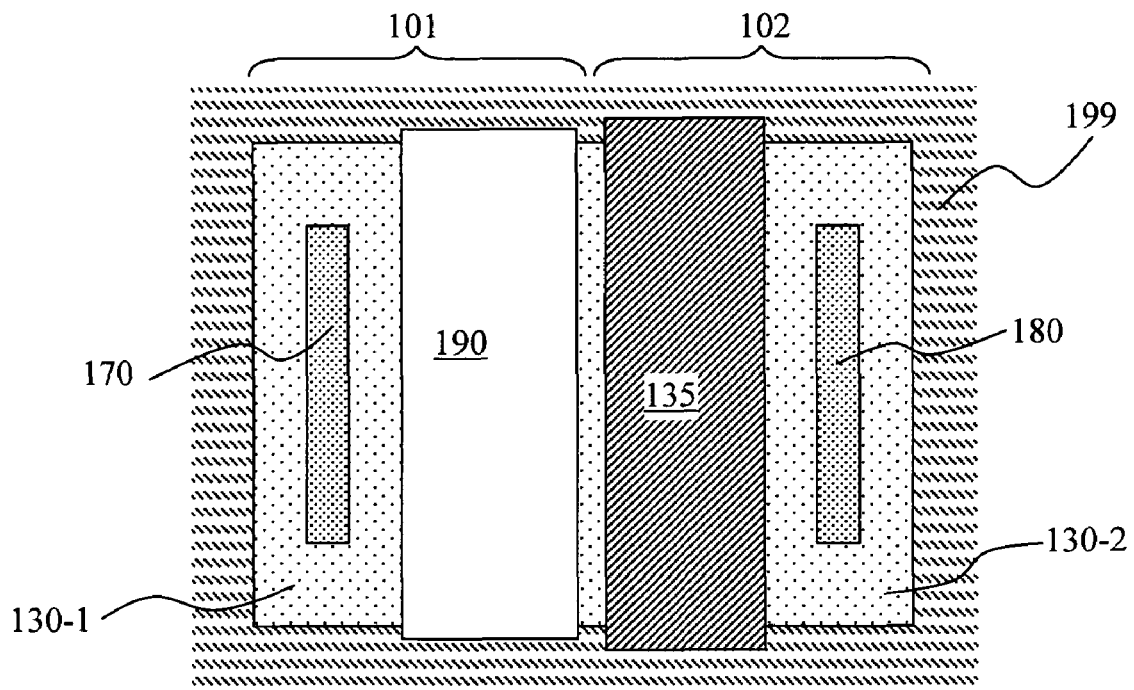
Fig. 3A Present Invention
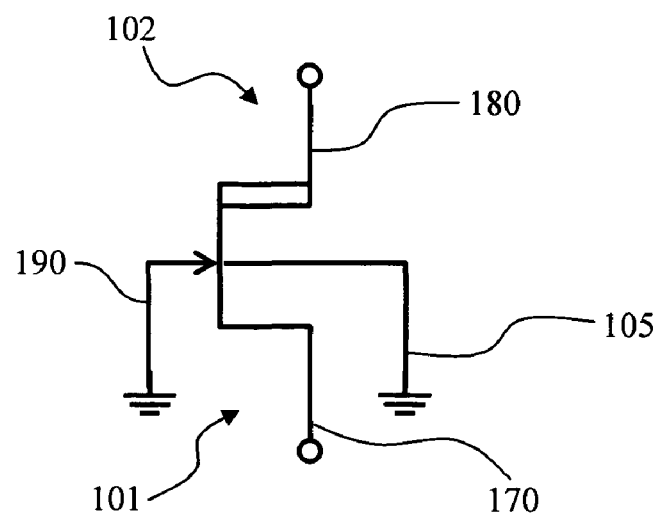
Fig. 3B Present Invention

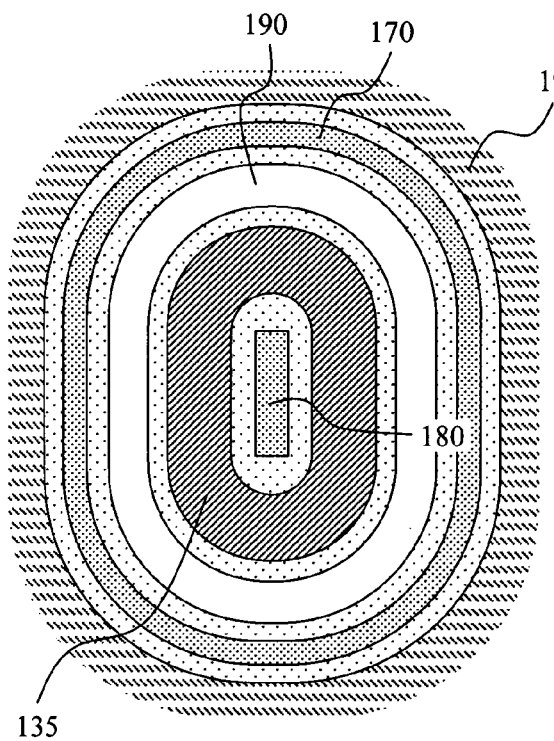
Fig. 4A Present Invention
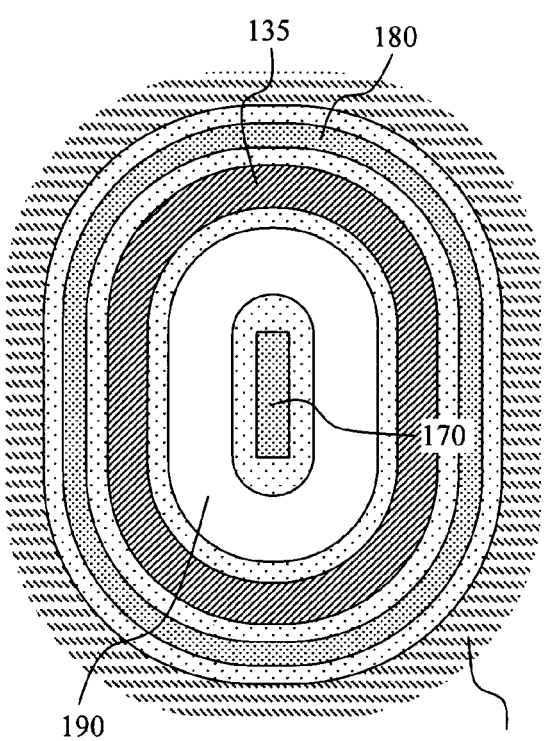
Fig. 4B Present Invention
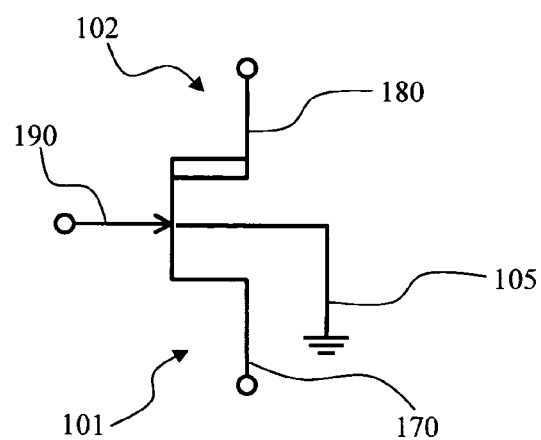
Fig. 4C Present Invention

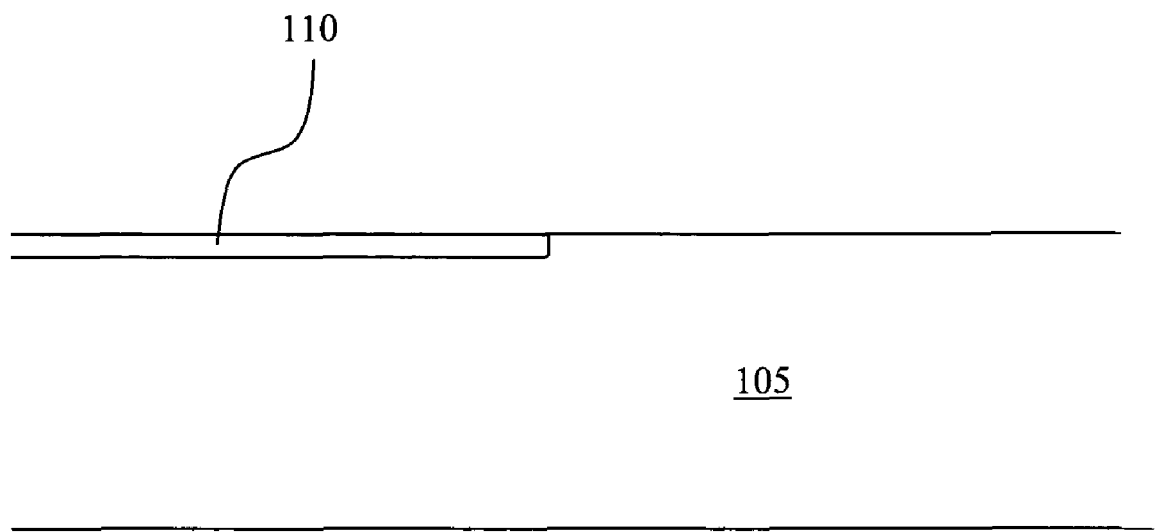
Fig. 5A Present Invention
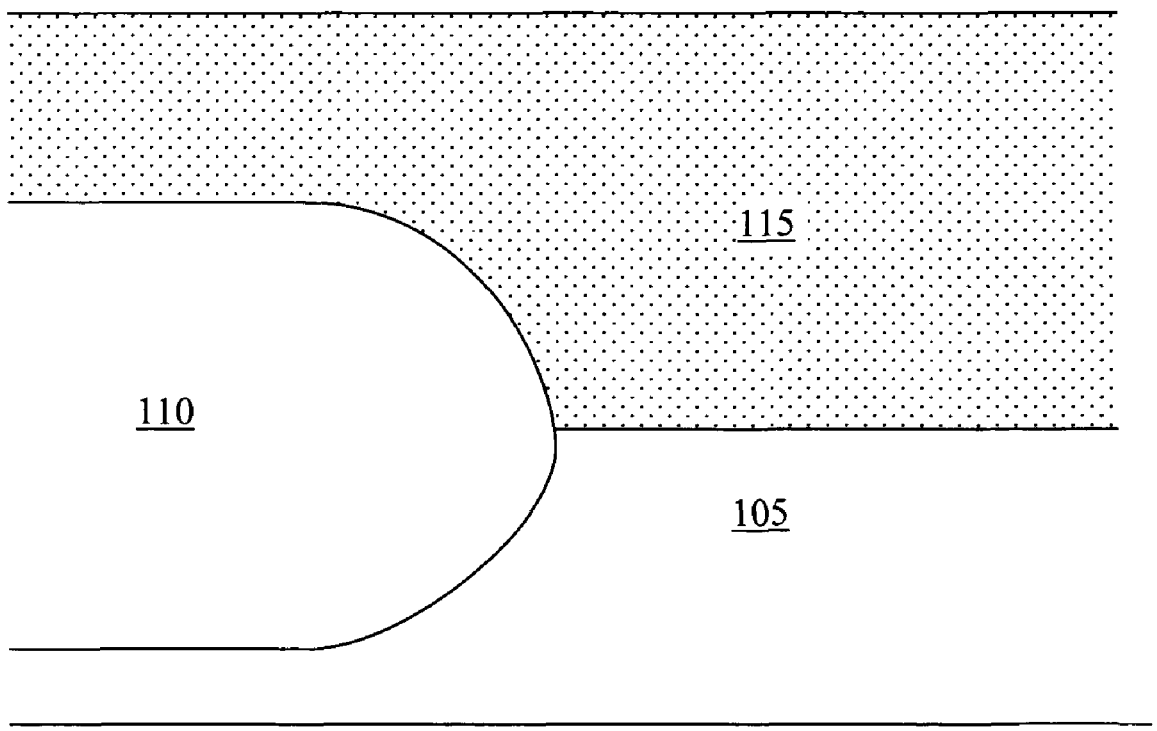
Fig. 5B Present Invention

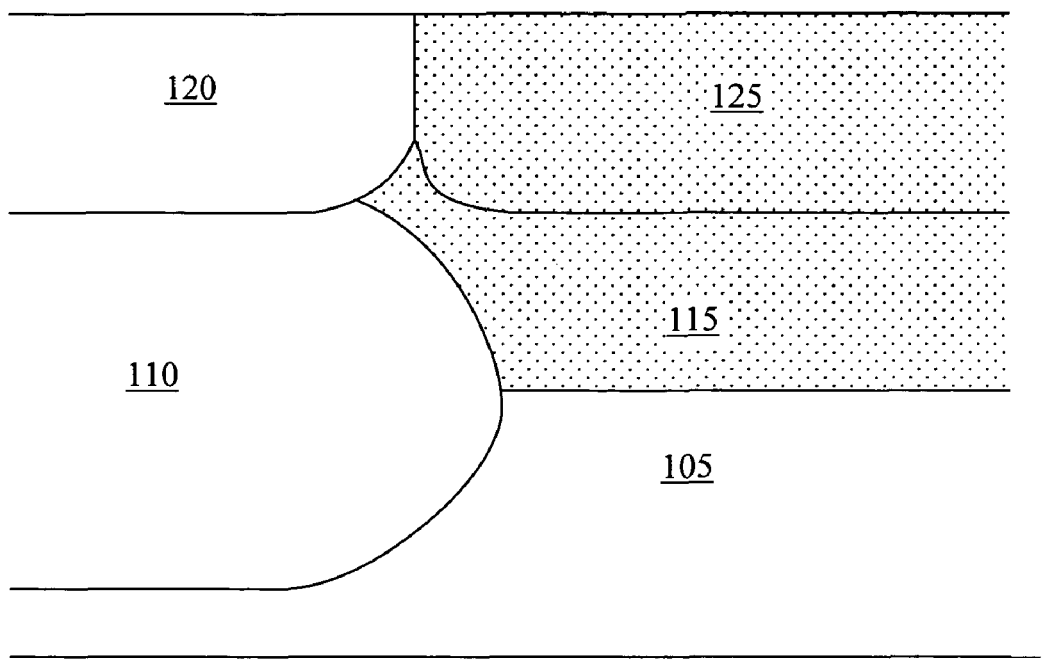
Fig. 5C Present Invention
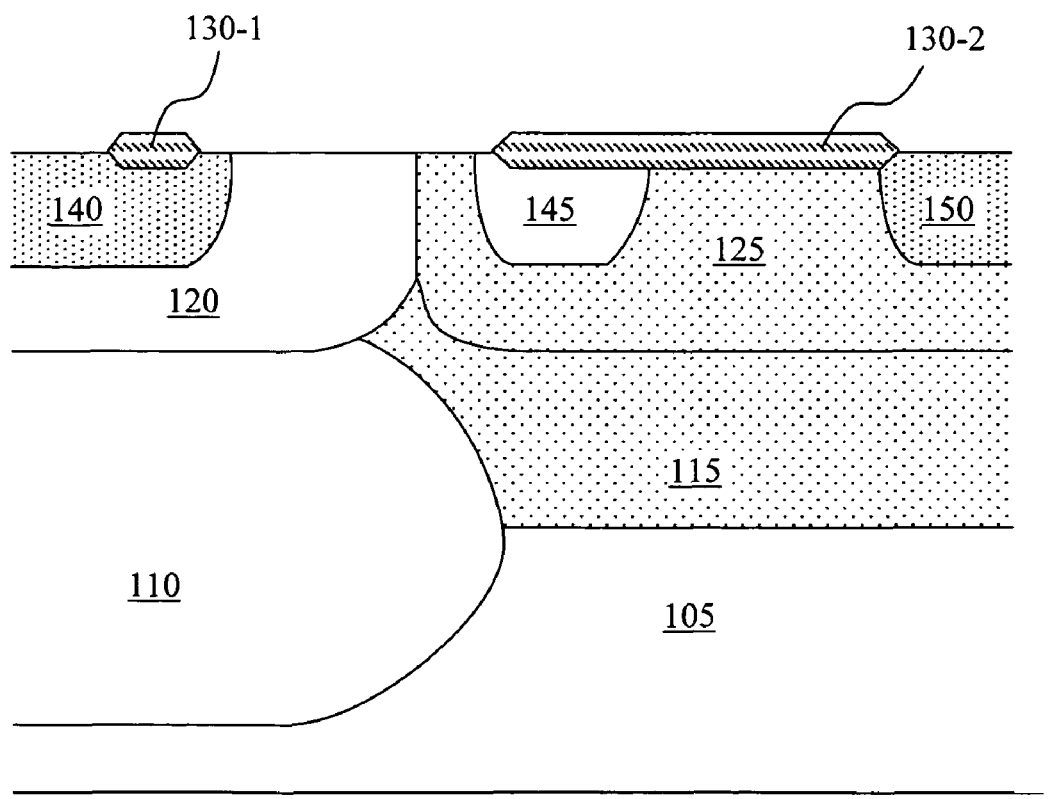
Fig. 5D Present Invention

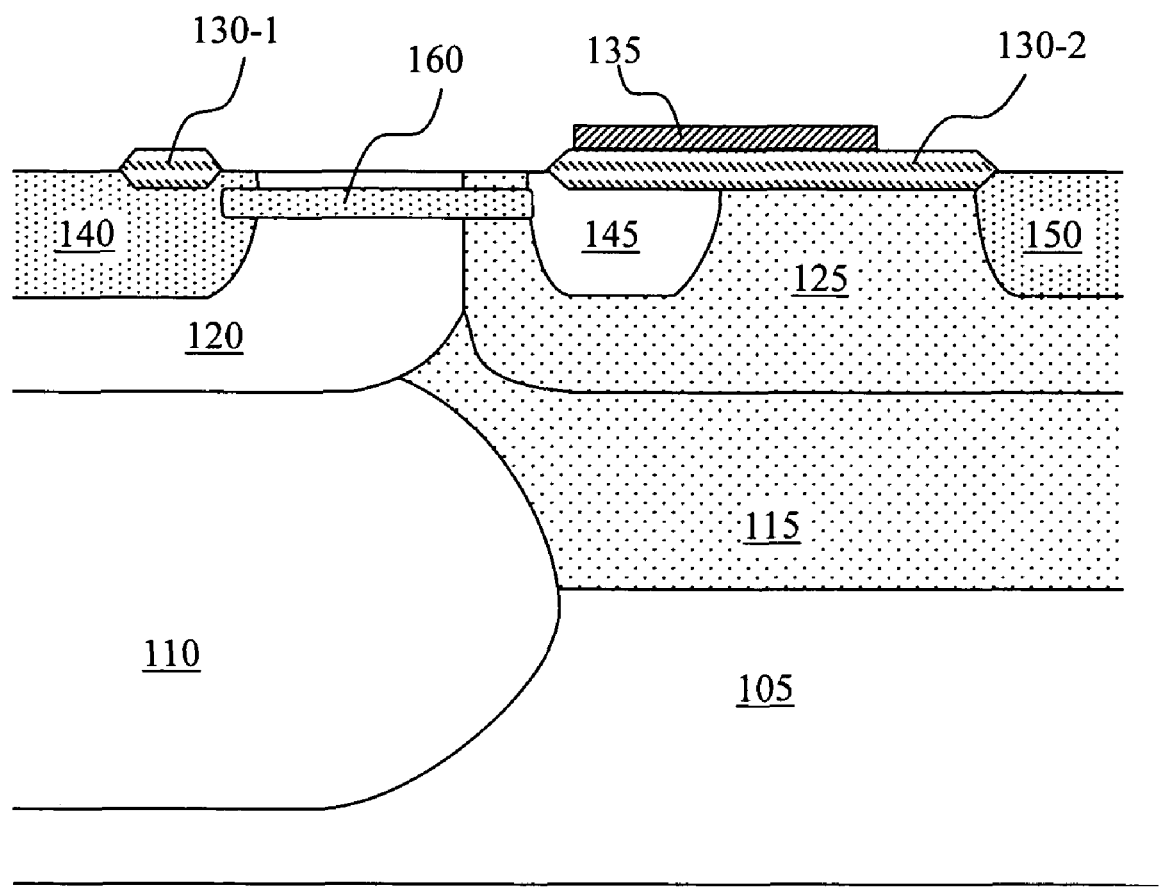
Fig. 5E Present Invention

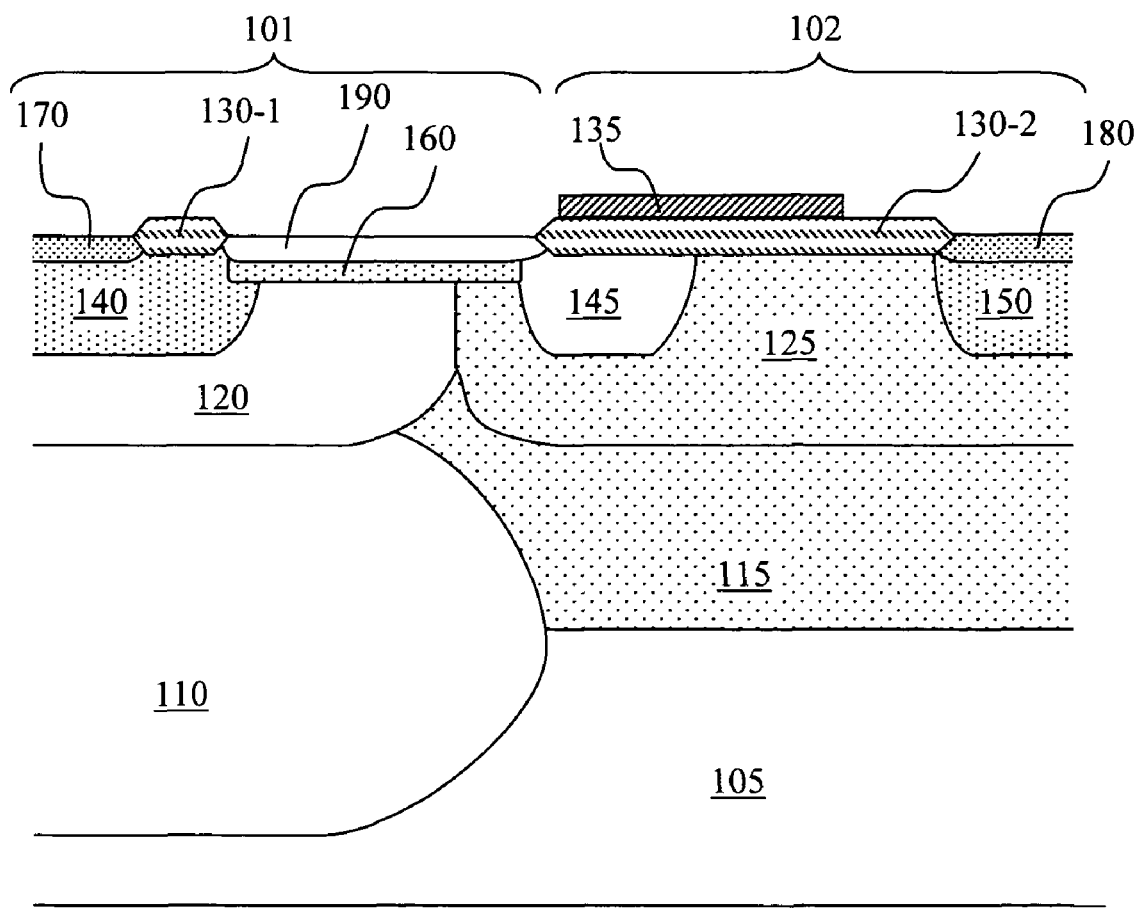
Fig. 5F Present Invention

US 8,097,905 B2

CASCODED HIGH VOLTAGE JUNCTION FIELD EFFECT TRANSISTOR

BACKGROUND OF THE INVENTION

1. Field of the Invention

The invention relates generally to semiconductor devices. More particularly, this invention relates to configurations and methods to manufacture a cascoded junction field effect transistor (JFET) device including a high voltage and a low voltage JFET to achieve wide operating voltage capability with tight pinch-off voltage (Vp) variations, especially for lower voltage devices.

2. Description of the Prior Art

The processes for manufacturing the conventional high voltage junction field effect transistor (JFET) device is limited by the highly sensitive performance variations caused by the thickness variations of the epitaxial layer functioning as the channel region. A conventional JFET device is formed either as a high voltage JFET device or a low voltage device, as shown in FIGS. 1A and 1B, respectively.

In the conventional high voltage JFET of FIG. 1A, the channel region, e.g., an N-channel region, is formed laterally under a P-type gate region between the source and the drain regions. The N-channel region is provided in an N-region and/or an N-type epitaxial (N-epi) layer (the N-epi layer may be grown on a P-type substrate). The N-channel is formed by the portions of the N-region and N-epi located between the P-gate region and the P-type substrate.

An effective thickness, t, of the N-channel varies according to the thickness variations of the epitaxial layer. The pinch-off voltage Vp of the JFET device thus varies with the thickness variations of the epitaxial layer, which can be large due to variabilities in manufacturing, effective doping of N-region and epitaxial layer, effective depth of P-gate region and auto-doping at N-epitaxial layer/P-type substrate interface during epitaxial growth. Because of channel thickness variations due to variations in the thickness of the N-epitaxial layer, the variations of the pinch off voltage Vp can be quite significant across each wafer, and from wafer to wafer and from lot to lot depending on variations in manufacturing conditions for each wafer and each lot.

Such Vp variations may be unacceptably large, especially when deep submicron technologies are implemented. Devices manufactured with deep submicron technologies usually have tight requirements for the maximum and typical operating voltages, i.e., there may not be a large margin between the maximum operating voltage and the typical operating voltages. For example, a 2 um device might have a 5V typical operating voltage and a 10V maximum voltage, whereas a 0.5 um device might have a 5V typical operating voltage and only a 6V maximum voltage. In the meantime, the pinch off voltage, Vp, of a JFET device must be lower than the absolute maximum voltage. But if the pinch off voltage Vp has large variations, the target pinch off voltage Vp must also be reduced accordingly to ensure that it does not exceed the maximum allowed voltage, resulting in a weaker JFET device. A JFET with a low Vp typically has a large channel resistance and cannot handle much current for its given size. In order to overcome the current-handling limitations due to lower Vp (e.g. caused by the epitaxial layer thickness variations), a JFET device needs to be implemented with greater size to provide greater channel area and better current handling capability. The size and production costs of such JFET devices are therefore increased.

On the other hand, an N-channel JFET with a shallow N-channel implant and shallow top gate implant to achieve a tight control over the Vp variation can be manufactured, like the conventional low voltage JFET shown in FIG. 1B. However, a JFET with shallow channel and gate region implant has a low operating voltage. Devices manufactured with such configurations can therefore be operated only with low operating voltages. For higher voltage operations, there are still limitations and difficulties for JFET devices manufactured with the conventional processes and configurations due to the thickness variations of the epitaxial layer and the sensitivities of the pinch off voltage (Vp) variations caused by these thickness variations.

In US Patent Application 2007/0012958, Hower et al. discloses a Junction Field Effect Transistor (JFET) that is fabricated with a well region functioning as a channel region having an average dopant concentration substantially less the average doping concentration of the remaining portions of the well region. The lower average doping concentration of channel region compared to the remaining portions of the well region reduces the pinch-off voltage of the JFET. The invention may be able to reduce the pinch off voltage but the teachings would not resolve the difficulties that high voltage applications with JFET devices are required to implement with greater size in order to overcome the limitations due to the uncertainties of the pinch off voltage.

Therefore, a need still exists in the art of power semiconductor device design and manufacture to provide new device configurations and manufacturing methods for forming the JFET power device such that the above discussed problems and limitations can be resolved.

SUMMARY OF THE INVENTION

It is therefore an aspect of the present invention to provide a new and improved device configuration and manufacturing method to form cascoded junction field effect transistor (JFET) that includes a first stage and a second stage JFET to achieve a low pinch off voltage with low pinch off voltage variations such that the above-discussed limitations and difficulties of convention JFET device can be resolved.

Specifically, one aspect of the present invention is to provide a new and improved device configuration and manufacturing method to form a cascoded JFET device that includes a low voltage JFET formed with a source region connected to a shallow buried channel region below a top gate. A high voltage (HV) JFET device (having a high breakdown voltage) is then formed on the drain of the low voltage (LV) JFET thus transferring a low voltage to the LV JFET. The cascoded JFET of the present invention has the benefit of high pinch off voltage as an operational characteristic of the HV JFET device with a low VP variation as an operational characteristic of the LV JFET. Therefore, compared with the conventional regular JFET device that either formed as to have a high Vp and high Vp variations or low Vp with a low Vp variation, the two-stage cascoded JFET device achieve improved performance by combining the advantages of both the HV and LV JFETs.

Briefly, in a preferred embodiment, this invention discloses a cascoded junction field transistor (JFET) device. The cascoded JFET device comprises a first stage JFET cascoded to a second stage JFET wherein one of the first and second stages JFET is connected to a drain electrode of another JFET stage.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2A and 2B is a cross sectional view and an equivalent circuit diagram of a cascoded JFET device of this invention.

FIG. 2C is a cross sectional view of an alternative embodiment of this invention similar to FIG. 2A.

FIG. 2D is a cross sectional view of an alternative embodiment of this invention similar to FIG. 2A.

FIG. 2E is a cross sectional view of an alternative embodiment of this invention similar to FIG. 2D.

FIGS. 3A and 3B are a top view and an equivalent circuit diagram respectively of a cascoded JFET device configured with a stripe or open cell layout.

FIGS. 4A, 4B, and 4C are a top views, and an equivalent circuit diagram respectively of cascoded JFET devices configured with circular or closed cell layouts.

FIGS. 5A to 5F are a series of cross sectional views showing a method of manufacturing a cascoded JFET device of FIG. 2A.

DETAILED DESCRIPTION OF THE METHOD

Figure 1A:
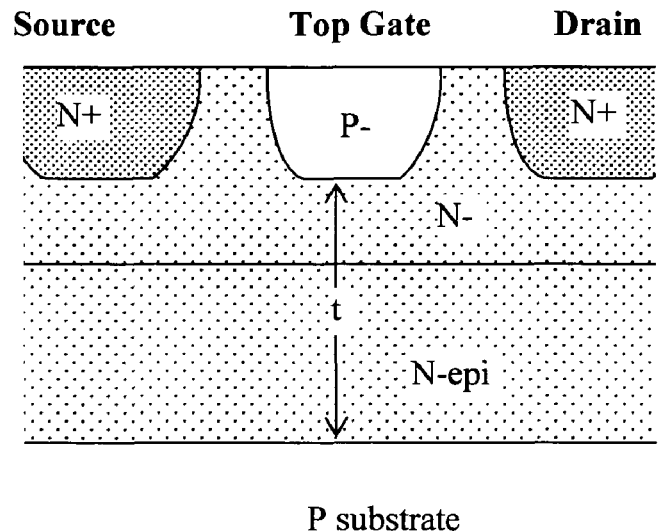
FIGS. 1A and 1B are cross sectional views for showing a conventional configuration of a high voltage and low voltage JFET device respectively.
Figure 1B:
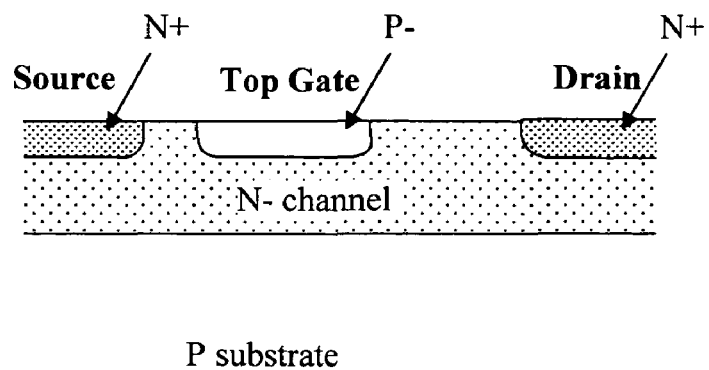

FIG. 2A is a cross sectional view of a cascoded high voltage junction field effect transistor (JFET) device of this invention. The cascoded HV JFET device is formed with a low voltage JFET 101 on the left cascoded to a high voltage JFET 102 on the right. The low voltage JFET 101 is formed in a high voltage P-well (HVPW) 120 on top of a P-buried layer (PBL) 110 supported on a (P-type) semiconductor substrate 105, and has an N+ source region 170 near the top surface of an N-well 140 encompassed in the HVPW 120. A high voltage well is a region having low doping and deep junction depth, which can sustain high voltage. The low voltage JFET 101 further includes a shallow N-channel 160 disposed immediately below a P+ top gate region 190. The shallow N-channel 160 is formed with a light dosage and semi-high energy implant in the lightly doped HVPW 120 and the top gate 190 is formed with a shallow P+ implant. By way of example, the P+ top gate 190 is only 0.1~0.3 microns deep. The N channel is few to several tenths of microns thick. So the depth of N channel implant is less than or up to 1 micron deep. The top gate 190 and the shallow N-channel 160 laterally extend from the N-well 140 to a P-well of the high voltage JFET 102. The HVPW 120 acts as the low voltage JFET 101 bottom gate and works with the top gate 190 to pinch off the low voltage JFET 101. The HVPW 120 may be connected to the bottom P substrate 105 through PBL 110. The P+ top gate and the source region 170 are separated by a first field oxide (FOX) segment 130-1.

The high voltage JFET 102 is formed as a deep junction JFET having a high voltage N-well (HVNW) 125 at the top of an N-epitaxial layer 115 supported on the P substrate 105. The HVNW 125 encompasses the P-well 145 contacting the top gate 190 extending from the low voltage JFET 101. The P well 145 acts as a top gate of the high voltage JFET 102. The HVNW 125 also connects to the N channel 160. The high voltage JFET 102 further includes an N+ drain region 180 on top of an N-well 150 encompassed in the HVNW 125 disposed on an opposite side from the P-well 145. The P well 145 is connected to the P+ top gate 190 of the LV JFET 101, and so is biased at the same voltage as P+ top gate 190. The HVPW 120, PBL 110 and P substrate 105 may act together as the bottom gate of the high voltage JFET 102. The portions of the HVNW 125 and the N-epi layer 115 between the P well 145 and the HVPW 120/PBL 110/P substrate 105 form the channel of the HV JFET 102. An optional polysilicon field plate 135 for increasing the drain operating voltage and improving the breakdown voltage may be formed on top of a second FOX segment 130 extending from the P-well 145 to the N-well 150 encompassed in the HVNW 125. The optional polysilicon (poly) field plate 135 may be connected to the top gate P well 145.

If the low voltage JFET 101 was by itself, the shallow P+ top gate 190 would see the drain voltage and the device would have a low breakdown voltage. Therefore, the low voltage JFET 101 is cascoded to the high voltage JFET 102 instead of a direct drain electrode to allow for high operating voltage. The present invention resolves the difficulties of the prior art JFET devices by implementing a cascoded low voltage JFET 101 with a high voltage JFET 102 at the drain pickup. The first stage JFET, i.e., the high voltage JFET 102, reduces the voltage and transfers a low voltage to the second stage, i.e., the low voltage JFET 101, thus allowing the low voltage JFET 101 to operate with a higher overall device voltage. The pinch-off voltage of the high voltage JFET 102 is lower than the breakdown voltage of the LV JFET 101 to prevent the LV JFET from breaking down before the HV JFET pinches off. In this cascoded configuration, the first stage has high VP and large VP variations while the second stage has low VP and tight VP variations; the VP of the cascoded device is determined by the second stage which has tight VP variations and therefore can be tightly controlled. The second stage may pinch off before the first stage, but the first stage reduces the voltage to a level the second stage can handle. The cascoded device of this invention therefore can achieve a high breakdown voltage of the HV JFET with a tightly controlled VP variation of the LV JFET.

FIG. 2B shows an equivalent circuit of the embodiment of this invention shown in FIG. 2A. In FIG. 2B, high voltage JFET 102 is cascode connected to low voltage JFET 101 in accordance to this invention. The resulting circuit acts like a single high voltage JFET (which internally includes both high voltage JFET 102 and low voltage JFET 101) with low pinch off voltage and low pinch off voltage variations.

FIG. 2C is a cross sectional view similar to FIG. 2A except that the HV JFET 102' of FIG. 2C has high voltage JFET top gate P well 145' decoupled from low voltage JFET top gate 190. The top gate P well 145' may further have a P+ region 146 at its top to allow good contact. In this embodiment, the top gates of the high voltage JFET 102 and of the low voltage JFET 101 can be controlled independently of each other.

FIG. 2D is a cross sectional view similar to FIG. 2A except for the inclusion of deep trench isolation (DTI) 198. The DTI 198 provides isolation for the JFET structures and allows for the top gate to be independently controlled (rather than grounded) even in stripe cell layouts.

FIG. 2E is a cross sectional view similar to FIG. 2D except for the inclusion of a semiconductor (e.g. silicon) on insulator (SOI) insulating layer 197, which isolates the bottom of the JFET structures. The bottom of the JFET structures may be formed in a P-type layer 111, which with P well 120 can act as a bottom gate. The P-type layer 111 can be accessed from the top by P+ contact region 191 through the P well 120. By way of example, the P+ contact region 191 can be located to the side of the device, outside of the source and drain regions.

FIGS. 3A and 3B are a top view and equivalent circuit diagram of a preferred embodiment of a cascoded JFET device of this invention. FIG. 3A shows a stripe layout for a structure similar to that shown in FIG. 2A with the source 170 disposed on the left next to the top P+ gate 190 as part of the LV JFET 101 with the polysilicon field plate 135 disposed on top of the FOX 130-2 and the drain region 180 disposed on the right side as part of the HV JFET 102 opposite from LV JFET 101. The P substrate 105 (not shown in FIG. 3A) can be contacted at the bottom to act as a bottom gate. FIG. 3B shows the top gate 190 and a bottom gate at the bottom surface of the substrate 105 are both grounded. This configuration is a three terminal device, with source, drain and ground (ground being connected to top and bottom gates). The drain current is determined by drain and source potentials. By way of example, the device may be surrounded by P-type junction isolation 199. By way of example, this configuration may be used in start-up circuits.

Of course, if desired, the gate may be independently controlled rather than connecting the gates to ground. If the cascoded JFET device has a stripe configuration and is integrated on an integrated circuit (IC), for the gates to be controlled independently the cascoded JFET may need some sort of dielectric isolation structure such as deep trench isolation (DTI), like shown in FIG. 2D, or semiconductor on insulator (SOI), like shown in FIG. 2E.

FIGS. 4A, 4B, and 4C are top views and an equivalent circuit diagram of another preferred embodiment of a cascoded JFET device of this invention. FIG. 4A shows a closed cell layout of a structure like that shown in FIG. 2A with the source 170 disposed on the outer peripheral enclosing the top P+ gate 190 as part of the LV JFET 101 formed on the outer part of the closed cell with the polysilicon field plate 135 enclosed by the top gate 190 and with the drain region 180 disposed on the innermost part of the closed cell as part of the HV JFET 102 opposite from LV JFET 101. The P substrate can be contacted at the bottom as a bottom gate. This configuration with the drain 180 disposed in the center of the closed cell, can be used in very high voltage devices. Because the JFET transfers a low voltage to the source 170 at the periphery of the closed cell, it is very easy to isolate this device. The closed cells may have a circular or oblong shape. FIG. 4B shows the reversed configuration, in which the source 170 is at the center of the closed cell configuration, and the drain 180 is at the outer periphery. The P+ top gate 190 of the LV JFET 101 surrounds the source 170, and the poly field plate 135 of the HV JFET 102 surrounds the P+ top gate. FIG. 4C shows the bottom gate at the bottom surface of the substrate 105 may be grounded, while the top gate can control the current. This configuration is a four terminal device: source, drain, top gate, and ground (ground being connected to bottom gate). Of course, the bottom gate (P substrate 105) may be configured to be independently controlled rather than connected to ground. If the cascoded JFET is integrated on an IC chip, the cascoded JFET may need an SOI structure like that shown in FIG. 2E to control the bottom gate independently.

FIGS. 5A to 5F are a series of cross sectional views for illustrating the manufacturing processes of a high voltage JFET device of this invention like that shown in FIG. 2A. In FIG. 5A, a P-buried layer (PBL) implant is performed to form a PBL layer 110 at the top of a P substrate 105. In FIG. 5B, an epitaxial layer 115 is grown on top of the substrate 105, during which the PBL layer 110 is diffused and expanded to occupy a region at the junction of the N-epitaxial layer 115 and the substrate 105. In FIG. 5C, a high-voltage (HV) P well 120 and a high voltage (HV) N well 125 are formed near the top surface of the epitaxial layer 115. In FIG. 5D, an insulating layer (e.g. field oxide (FOX)) segments 130-1 and 130-2 are formed (e.g. grown) at the top surface on top of the HV P-well 120 and the HV N-well 125, respectively. Next is forming an N well 140 in the HV P-well 130 under the FOX segment 130-1, and P-well 145 and N-well 150 in the HV N-well 125, at opposite ends of the FOX segment 130-2. Then, in FIG. 5E, a semi-high energy N-channel implant is carried out to form a shallow N-channel 160 from the N-well 140 across the HV P-well 120 to reach the P well 145 and the HV N-well 125. Next is forming and patterning a polysilicon field plate 135. Though N-channel 160 may be formed in the epitaxial layer 115, the epi layer 115 is not a part of the low voltage N-channel 160. On the other hand, epi-layer 115 is a part of the high voltage channel region (along with HV N well 125.) In FIG. 5F, an N+ implant is carried out to form the N+ source region 170 adjacent to the FOX segment 130-1 at the top of the N-well region 140 encompassed in the HV P well 120 and to form the N+ drain region 180 next to the FOX segment 130-2 at the top of the N-well 150 encompassed in the HV N-well 125. A P+ implant is carried out to form a top gate region 190 on top of the N-channel 160. The top gate region 190 is formed self-aligned to the field oxides 130-1 and 130-2.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, there may be many variations such as eliminating poly field plate, eliminating the field oxide between source and top gate, eliminating the P well in drain side, using one layer each of N well and P well instead of two each, eliminating PBL, etc. Accordingly, it is intended that the appended claims be interpreted as covering all alterations and modifications as fall within the true spirit and scope of the invention.

I claim:

1. A cascoded junction field transistor (JFET) device comprising:
    a first stage JFET cascoded to a second stage JFET, wherein the first stage JFET is a high voltage JFET and the second stage JFET is a low voltage JFET; and
    the high voltage JFET is configured with a higher pinch-off voltage and a higher variation of pinch off voltage than the low voltage JFET and said high voltage JFET transmits a reduced voltage to the low voltage JFET, such that a pinch off voltage of said cascoded JFET device is determined by the lower pinch-off voltage and smaller variation of pinch off voltage of said low voltage JFET.

2. The cascoded JFET device of claim 1 wherein:
    the low voltage JFET further comprises a low voltage JFET shallow channel implant region of a first conductivity type located under a low voltage JFET shallow top gate region of a second conductivity type.

3. The cascoded JFET device of claim 2 wherein:
    the low voltage JFET shallow channel implant region has a depth of less than one micron.

4. The cascoded JFET device of claim 2 wherein:
    the high voltage JFET further includes a high voltage channel region of a first conductivity type formed over a bottom substrate of a second conductivity type, wherein the high voltage channel region includes a portion of an epitaxial layer of a first conductivity type.

5. The cascoded JFET device of claim 4 wherein:
    the high voltage JFET further includes a high voltage top gate region of a second conductivity type located over the high voltage channel region.

6. The cascoded JFET device of claim 2 wherein:
the low voltage JFET shallow channel implant region is formed over a low voltage JFET bottom gate region.

7. The cascoded JFET device of claim 6 wherein:
the low voltage JFET bottom gate region comprises a semiconductor region of a second conductivity type having a low doping and a deep junction depth.

8. The cascoded JFET device of claim 7 wherein:
the semiconductor region of a second conductivity type having low doping and deep junction depth is located above and connected to a buried layer of a second conductivity type and a bottom substrate of a second conductivity type.

9. The cascoded JFET device of claim 8 wherein:
the semiconductor region of a second conductivity type having low doping and deep junction depth, the buried layer, and the bottom substrate form the bottom gate of the low voltage JFET.

10. The cascoded JFET device of claim 9 wherein:
the low voltage JFET channel region is connected to a high voltage JFET channel region, said high voltage channel region including an epitaxial layer of a first conductivity type located over the bottom substrate.

11. The cascoded JFET device of claim 2 further comprising:
a polysilicon field plate formed over a portion of the high voltage JFET.

12. The cascoded JFET device of claim 2 further comprising:
the cascoded JFET device has a closed cell configuration wherein one of said high voltage JFET or said low voltage JFET is located on an inside portion of the closed cell and the other of said high voltage JFET or said low voltage JFET surrounds said one of said high voltage JFET or said low voltage JFET.

13. The cascoded JFET device of claim 2 wherein:
the cascoded JFET device has a stripe configuration.

14. The cascoded JFET device of claim 13 wherein:
the top gate and a bottom gate of the cascoded JFET device are connected to ground.

15. The cascoded JFET device of claim 2 wherein:
the top gate is controlled externally, and a bottom gate of the cascoded JFET device is connected to ground.

16. The cascoded JFET device of claim 2 wherein:
the high voltage JFET further comprises a high voltage top gate separated from a low voltage top gate such that the high voltage top gate may be controlled independently from the low voltage top gate.

17. The cascoded JFET device of claim 2 further comprising:
a deep trench isolation to isolate the cascoded JFET.

18. The cascoded JFET device of claim 2 further comprising:
a semiconductor on insulator (SOI) insulating layer under the cascoded JFET, wherein a bottom gate region of the cascoded JFET is accessible from the top at the periphery of the cascoded JFET.

19. A method of forming a cascoded junction field effect transistor (JFET) device comprising:
forming a first stage JFET in a cascode configuration with a second stage JFET, wherein the first stage JFET is a high voltage JFET and the second stage JFET is a low voltage JFET; and
configuring the high voltage JFET with a higher pinch-off voltage and a higher variation of pinch off voltage than the low voltage JFET, and configuring said high voltage JFET to transmit a reduced voltage to the low voltage JFET such that a pinch off voltage of said cascoded JFET device is determined by the lower pinch-off voltage and lower variation of pinch off voltage of said low voltage JFET.

20. The method of claim 19 further comprising:
implanting a low voltage JFET shallow channel region under a low voltage JFET shallow top gate region.

* * * * *